United States Patent [19]

Chamzas et al.

[11] Patent Number: 5,023,611
[45] Date of Patent: Jun. 11, 1991

[54] ENTROPY ENCODER/DECODER INCLUDING A CONTEXT EXTRACTOR

[75] Inventors: Christodoulos Chamzas, West Long Branch; Donald L. Duttweiler, Rumson, both of N.J.

[73] Assignee: AT&T Bell Laboratories, Murray Hill, N.J.

[21] Appl. No.: 386,537

[22] Filed: Jul. 28, 1989

[51] Int. Cl.⁵ .............................................. H03M 7/34
[52] U.S. Cl. ........................................ 341/51; 341/107
[58] Field of Search ........................... 341/107, 51, 50; 358/430, 426

[56] References Cited

U.S. PATENT DOCUMENTS

| | | | |
|---|---|---|---|
| 4,494,108 | 1/1985 | Langdon, Jr. et al. | 341/51 |
| 4,633,490 | 12/1986 | Goertzel et al. | 375/122 |
| 4,881,075 | 11/1989 | Weng | 341/51 X |
| 4,891,643 | 1/1990 | Mitchell et al. | 341/51 X |

OTHER PUBLICATIONS

G. G. Langdon, Jr. et al., "Compression of Black-White Images with Arithmetic Coding", *IEEE Transactions on Communications*, vol. Com-29, No. 6, Jun. 1981, pp. 858-867.

I. H. Witten et al., "Arithmetic Coding for Data Compression", *Communications of the ACM*, vol. 30, No. 6, Jun. 1987, pp. 520-540.

A. Desoky et al., "Compression of Text and Binary Files Using Adaptive Huffman Coding Techniques", *IEEE Southeast Conference*, Apr. 11-13, 1988, Knoxville, Tenn., pp. 660-663.

R. B. Arps et al., "Progressive Binary Image Compressor (PBIC)", *ISO, International Organization for Standardization*, ISO/IEC/JTC1/SC2/WG8 JBIG No. 33, Rev. 6, Jun. 28, 1989, pp. 1-37.

*Primary Examiner*—William M. Shoop, Jr.
*Assistant Examiner*—Sharon D. Logan
*Attorney, Agent, or Firm*—Thomas Stafford

[57] ABSTRACT

In entropy, e.g., arithmetic or adaptive Huffman, encoding/decoding a context based on prior symbols is needed to provide accurate predictions of symbols to be encoded/decoded. Encoding/decoding efficiency is improved by employing an adaptive context extractor. The adaptive context extractor automatically adjusts the configuration of the lag intervals used to define the context. This is realized by adaptively incorporating into the context configuration at least one lag interval found to have a "good" predictive value relative to the particular symbol stream being encoded/decoded. The context configuration adjustment is such that the at least one found lag interval is exchanged with the lag interval currently in an at least one so-called floating predictor position.

20 Claims, 4 Drawing Sheets

| CONTEXT CONFIGURATION (LAG INTERVALS) | CURRENT CONTEXT | LATER CONTEXT | LATER CONTEXT |
|---|---|---|---|
| $\ell_0$ | 1 | 1 | 1 |
| $\ell_1$ | 2 | 2 | 2 |
| $\ell_2$ | R-2 | R-2 | R-2 |
| $\ell_3$ | R-1 | R-1 | R-1 |
| $\ell_4$ | R+1 | R+1 | R+1 |
| $\ell_5$ | R+2 | R+2 | R+2 |
| $\ell_6$ | R | R | R |
| $\ell_7$ | 3 | ⑥ | ⑧ |
| $\ell_8$ | 4 | 4 | 4 |
| $\ell_9$ | 5 | 5 | 5 |
| $\ell_{10}$ | 6 | ③ | 3 |
| $\ell_{11}$ | 7 | 7 | 7 |
| $\ell_{12}$ | 8 | 8 | ⑥ |
| $\ell_{13}$ | 9 | 9 | 9 |
| $\ell_{14}$ | 10 | 10 | 10 |
| $\ell_{15}$ | 11 | 11 | 11 |
| $\ell_{16}$ | 12 | 12 | 12 |

FIXED ← $\ell_0$ – $\ell_6$
FLOATING PREDICTOR ← $\ell_7$
CANDIDATES ← $\ell_8$ – $\ell_{16}$

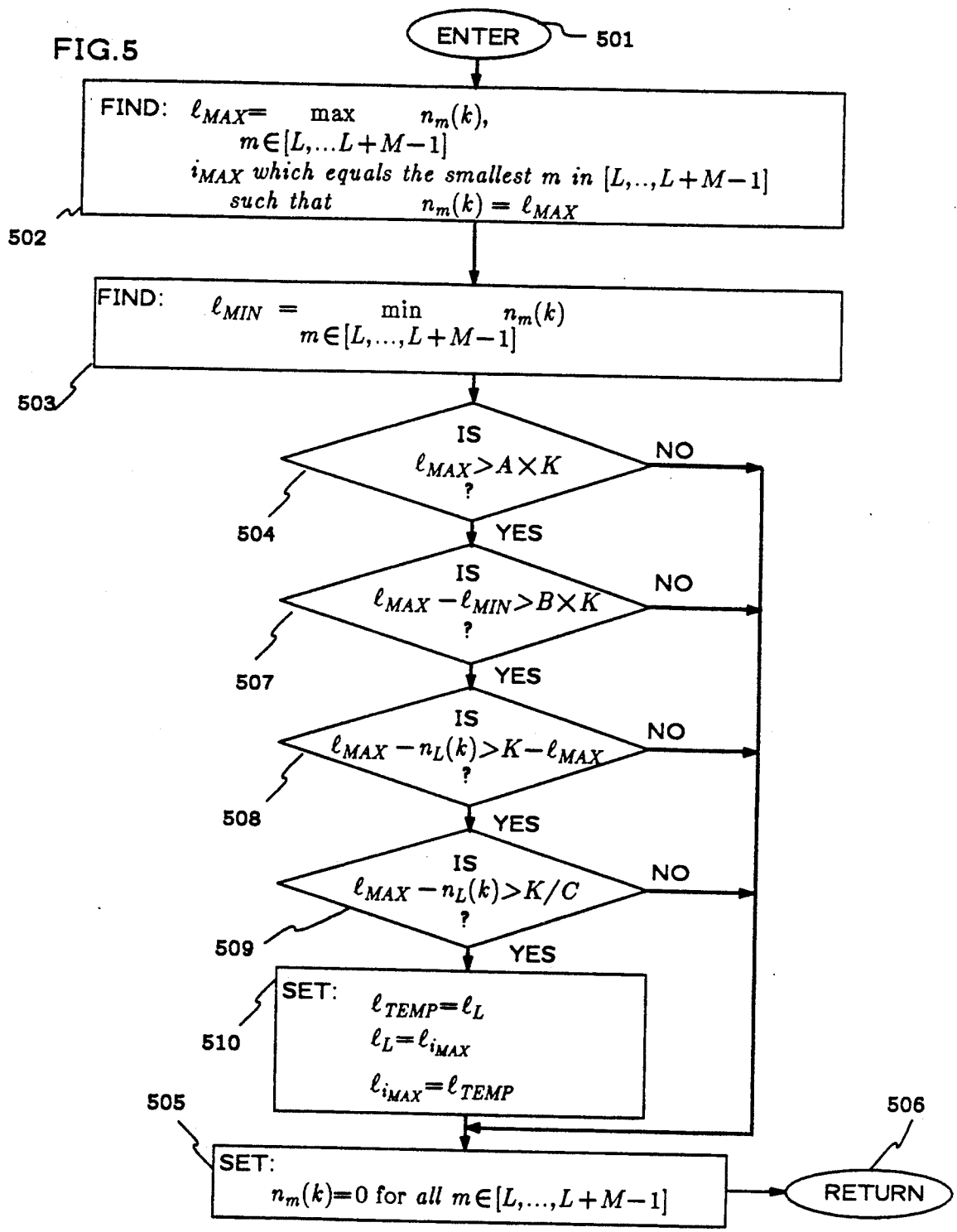

ENTROPY ENCODER/DECODER INCLUDING A CONTEXT EXTRACTOR

CROSS-REFERENCE TO RELATED APPLICATION

U.S. patent application of D. L. Duttweiler Ser. No. 359,559 was filed on June 1, 1989.

TECHNICAL FIELD

This invention relates to the coding of signals and, more particularly, to a context extractor for entropy encoding/decoding.

BACKGROUND OF THE INVENTION

It is known that in an entropy encoder/decoder, e.g., arithmetic or adaptive Huffman, a probability estimate is required of the current symbol to be encoded/decoded. The probability estimate is usually conditional in the sense that it is dependent on values of the signal at prior symbol times. The particular choice of the positions of prior symbols to be used in predicting the current symbol is called the "context configuration" in entropy encoding/decoding.

In general, a large context configuration referencing many prior symbols will provide a more accurate prediction of the current symbol. A problem with using such a large context configuration is that it is complex to implement since it requires a large memory. Additionally, it will cause a probability estimator to take a significantly longer time to reach "good" estimates of probability. Indeed, during intervals of changing signal statistics the probability estimator may be unable to track the changes with a consequent reduction in encoding/decoding efficiency.

Prior known entropy encoders/decoders have heretofore employed fixed context configurations. A problem with such arrangements is that if a particular symbol positioned prior to the current symbol by a particular number of symbol intervals, i.e., a particular "lag" interval, happened to be an excellent predictor of the current symbol but its lag interval was not in the fixed context configuration, its predictive value would not be exploited. Consequently, this limited the efficiency of the encoders/decoders.

SUMMARY OF THE INVENTION

The problems and other limitations of prior known entropy encoders/decoders are overcome, in accordance with an aspect of the invention, by employing an adaptive context extractor.

More specifically, an adaptive context extractor is employed which automatically adjusts the configuration of lag intervals used to define the context. This is realized by adaptively incorporating into the context configuration at least one prior symbol at a lag interval found to have a good predictive value relative to the particular symbol stream being currently encoded/decoded. The context configuration adjustment is such that the at least one found lag interval is exchanged with the lag interval currently in an at least one so-called floating predictor position.

In an embodiment of the invention, an adaptive context extractor is used in which so-called running measures are obtained and retained of the correlation between signal values separated by fixed lag intervals. If a "high" degree of correlation, either positive or negative, is found at some particular lag interval, the prior symbol preceding the current symbol being encoded/decoded by that particular lag interval is incorporated into the context configuration.

BRIEF DESCRIPTION OF THE DRAWING

In the Drawing:

FIG. 5 shows a flowchart of the context configuration changer employed in the flowchart of FIG. 4.

DETAILED DESCRIPTION

Figure 1:
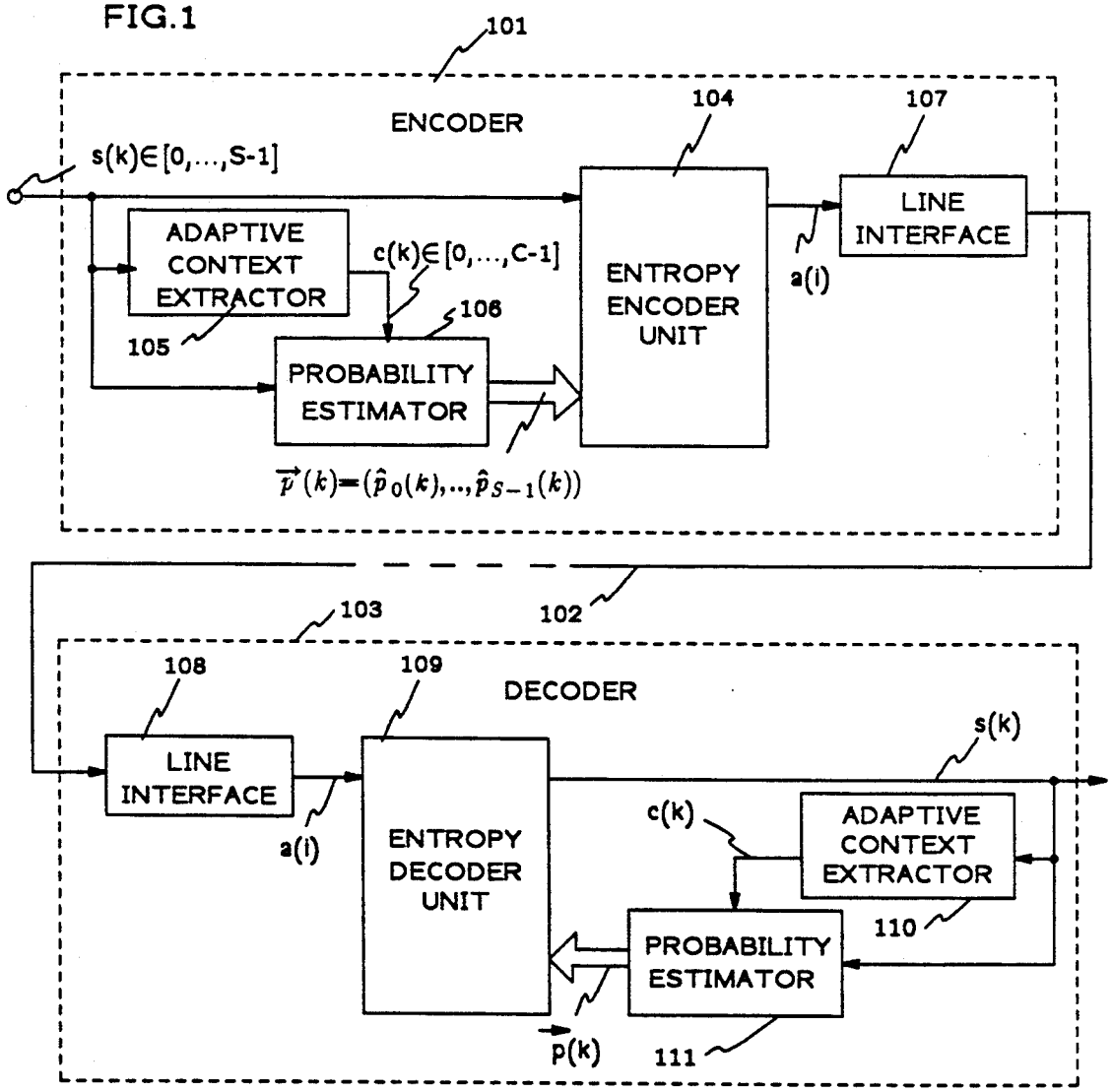
FIG. 1 shows details of an arrangement employing an encoder and remote decoder employing an embodiment of the invention.

FIG. 1 shows details of encoder 101 in simplified block diagram form, including aspects of the invention, which receives data symbols $s(k)$, encodes them into a compressed data stream $a(i)$ and interfaces them to a transmission media 102 for transmission to remote decoder 103. Decoder 103, also including aspects of the invention, interfaces to transmission media 102 to obtain the received data stream and decodes it to obtain reconstructed replicas of the original symbols $s(k)$. Symbols $s(k)$ are chosen from the integers $[0, \ldots, S-1]$. Thus, the symbols may be multi-level ($S>2$) or bi-level ($S=2$) as desired. The assumption that the symbol values are positive integers is for clarity of exposition. Generalizations allowing symbols to take on other than integer values will be obvious to those skilled in the art.

Accordingly, encoder 101 includes, in this example, entropy encoder unit 104, adaptive context extractor 105, probability estimator 106 and line interface 107. Context $c(k)$ is provided, in accordance with an aspect of the invention, and is supplied to probability estimator 106. Symbols $s(k)$ and probability estimates $\bar{p}(k)$ are supplied to entropy encoder unit 104 and employed therein in known fashion to generate an encoded data stream $a(i)$. Such entropy encoder units are known in the art and may be, for example, an arithmetic encoder or an adaptive Huffman encoder. See, for example, an article entitled "Compression of Black-White Image with Arithmetic Coding", *IEEE Transactions On Communications*, VOL. COM.-29, No. 6, June 1981, pages 858–867, and U.S. Pat. No. 4,633,490 issued Dec. 30, 1986 for arithmetic encoders/decoders used to encode and decode symbols having binary elements. Also see an article entitled, "Arithmetic Coding For Data Compression", *Communications of the ACM*, Volume 30, No. 6, June 1987, pages 520–540, for an arithmetic encoder/decoder used to encode/decode symbols having multi-level elements. For Huffman type encoders/decoders see an article entitled "Compression of Text and Binary Files Using Adaptive Huffman Coding Techniques", IEEE Southeast Conference, Apr. 11–13, 1988, Knoxville, Tenn., pages 660–663.

Line interface 107 interfaces the encoded data stream $a(i)$ to transmission media 102 which, in turn, supplies the data stream to remote decoder 103. To this end, line interface 107 includes appropriate apparatus for formatting the data stream into the signal format employed in transmission media 102. Some well known examples of possible transmission media 102 are T-carrier trunks, ISDN basic subscriber lines, local area networks and the like. Such line interface apparatus is known in the art.

Probability estimator 106 is advantageously employed to generate probability estimates $\vec{p}(k) = (\hat{p}_0(k), \ldots, \hat{p}_{S-1}(k))$ for incoming symbol $s(k)\epsilon[0, \ldots, S-1]$ and associated context $c(k)\epsilon[0, \ldots, C-1]$ from adaptive context extractor 105. Any of a number of known probability estimators may be used for probability estimator 106. Preferably, an adaptive probability estimator is employed of the type disclosed in the copending U.S. patent application of D. L. Duttweiler Ser. No. 359,559, filed June 1, 1989.

Adaptive context extractor 105 provides, in accordance with an aspect of the invention, the context $c(k)$, where $c(k)\epsilon[0, \ldots, C-1]$, of received symbol $s(k)$. That is to say, adaptive context extractor 105 generates a unique context for the current symbol $s(k)$ being encoded dependent on prior supplied symbols. Adaptive context extractor 105 can be readily implemented by appropriately programming a computer or digital signal processor. It is envisioned, however, that a superior mode of implementation is in a very large scale integrated (VLSI) circuit configuration on a semiconductor chip.

For brevity and clarity of description, a specific embodiment of the invention, not to be construed as limiting the scope of the invention, will be described relating to images (two dimensional data) in which pixels, i.e., picture elements, are represented by bi-level signals. It will be apparent to those skilled in the art how to apply the invention to multi-level signals or how to apply the invention to signals that are not of dimensionality two. Speech is an example of a one dimensional, multi-level signal and video is an example of a three dimensional, multi-level signal.

Figures 2, 3:
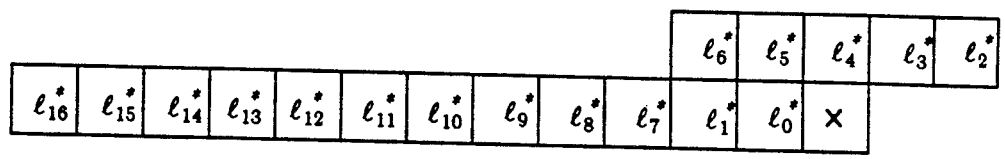
FIG. 2 is a graphic illustration of symbols used in adaptively obtaining a context.
FIG. 3 is a graphic illustration useful in describing the adaptive incorporation of at least one prior lag interval into the context configuration.

Accordingly, shown in FIG. 2 are a number of pixel positions, where position X indicates the current pixel to be encoded corresponding to a current symbol $s(k)$, the lag intervals $l_0^*$ through $l_6^*$ point to positions of prior pixels (symbols) in a so-called fixed portion of a context configuration used in providing context $c(k)$ for predicting X, the pixel position at lag interval $l_7^*$ is a candidate position and is designated a so-called floating predictor position that is initially included in the context configuration along with the fixed portion and pixel positions at lag intervals $l_8^*$ through $l_{16}^*$ also point to candidate pixels. That is to say, the context configuration includes a fixed portion and a so-called floating portion including at least one floating predictor position. In this example, the pixel positions at lag intervals $l_0^*$, $l_1^*$ and $l_7^*$ through $l_{16}^*$ are in the same row of an image as the current pixel position X, while the pixel positions at lag intervals $l_2^*$ through $l_6^*$ are in a prior row and in a prescribed relationship to current pixel position X. A pixel in at least one of the positions at lag intervals $l_7^*$ through $l_{16}^*$ is controllably selected, in accordance with an aspect of the invention, to be included in the floating predictor position $l_7$ in the context configuration. Accordingly, in this example, the initial context configuration includes the prior pixels in the positions at lag intervals $l_0^*$ through $l_6^*$ and floating predictor position $l_7^*$.

FIG. 3 is a graphic illustration of an aspect of the operation of the invention in adaptively incorporating pixels (symbols) at particular lag intervals from the candidate set into the context configuration. Although the example being described assumes that only one lag interval from the candidate set is to be incorporated into the context configuration, it will be apparent to those skilled in the art that more than one lag interval could be incorporated, if desired. In this example, the number of pixels (symbols) in a row is denoted by R and a so-called fixed portion of the context configuration includes pixels in positions at lag intervals $l_0^*$ through $l_6^*$, where $l_0^*=1$, $l_1^*=2$, $l_2^*=R-2$ (prior row and two to the right), $l_3^*=R-1$, $l_4^*=R$, $l_5^*=R+1$ and $l_6^*=R+2$. The current floating predictor position is at lag interval $l_7=l_7^*=3$. The remaining candidate positions are at lag intervals $l_8=l_8^*=4$, $l_9=l_9^*=5$, $l_{10}=l_{10}^*=6$, $l_{11}=l_{11}^*=7$, $l_{12}=l_{12}^*=8$, $l_{13}=l_{13}^*=9$, $l_{14}=l_{14}^*=10$, $l_{15}=l_{15}^*=11$ and $l_{16}=l_{16}^*=12$. If at a later time it is determined that a pixel at a lag interval in another of the candidate positions is a significantly better predictor for X than the pixel at lag interval $l_7=3$, then that lag interval is adaptively exchanged, in accordance with an aspect of the invention, with the lag interval currently in the floating predictor position of the context configuration, i.e., $l_7$, and thereby incorporated into the context configuration. For example, as shown in FIG. 3, if at some later time the pixel referenced by $l_{10}$ (that is, six (6) positions to the left of the current pixel X) is determined to be a significantly better predictor for the current pixel X than is the pixel referenced by $l_7$ (that is, three (3) positions to the left of the current pixel X), then $l_7$ is changed to $l_{10}^*$ while $l_{10}$ is changed to $l_7^*$. Since the pixel referenced by $l_7$ is the pixel incorporated into the context configuration, the pixel at lag interval $l_{10}^*$ will now be in the context configuration. That is to say, the pixel six (6) positions to the left of the current pixel X is adaptively exchanged for the pixel three (3) positions to the left of the current pixel X. Continuing, if at some still later time it is determined that a pixel located at a different lag interval is now a significantly better predictor for current pixel X, that lag interval will be adaptively exchanged for $l_7$ (now $l_{10}^*$). Thus, in the example of FIG. 3, the pixel at lag internal $l_{12}$ (eight (8) positions to the left of current pixel X) is determined to be a significantly better predictor and the lag interval $l_{12}$ is adaptively exchanged for $l_7=l_{10}^*=6$. The context configuration remains fixed until the next adaptive exchange, i.e., adjustment, is made. In this manner the context configuration is adaptively adjusted, in accordance with an aspect of the invention.

It is to be noted that any new lag interval being considered for movement to the at least one floating predictor position must reference a significantly better predictor than is referenced by the current floating predictor lag interval because it is undesirable to change the context configuration too often. The reason for this is that once the context configuration is changed, it takes some time for probability estimator 106 to stabilize and learn the new probability values. During this time the performance of the entropy encoder is suboptimal. Consequently, in considering changing the predictors in the context, possible improvement in the prediction quality must be balanced against the time required to learn the new probability estimates.

Figure 4:
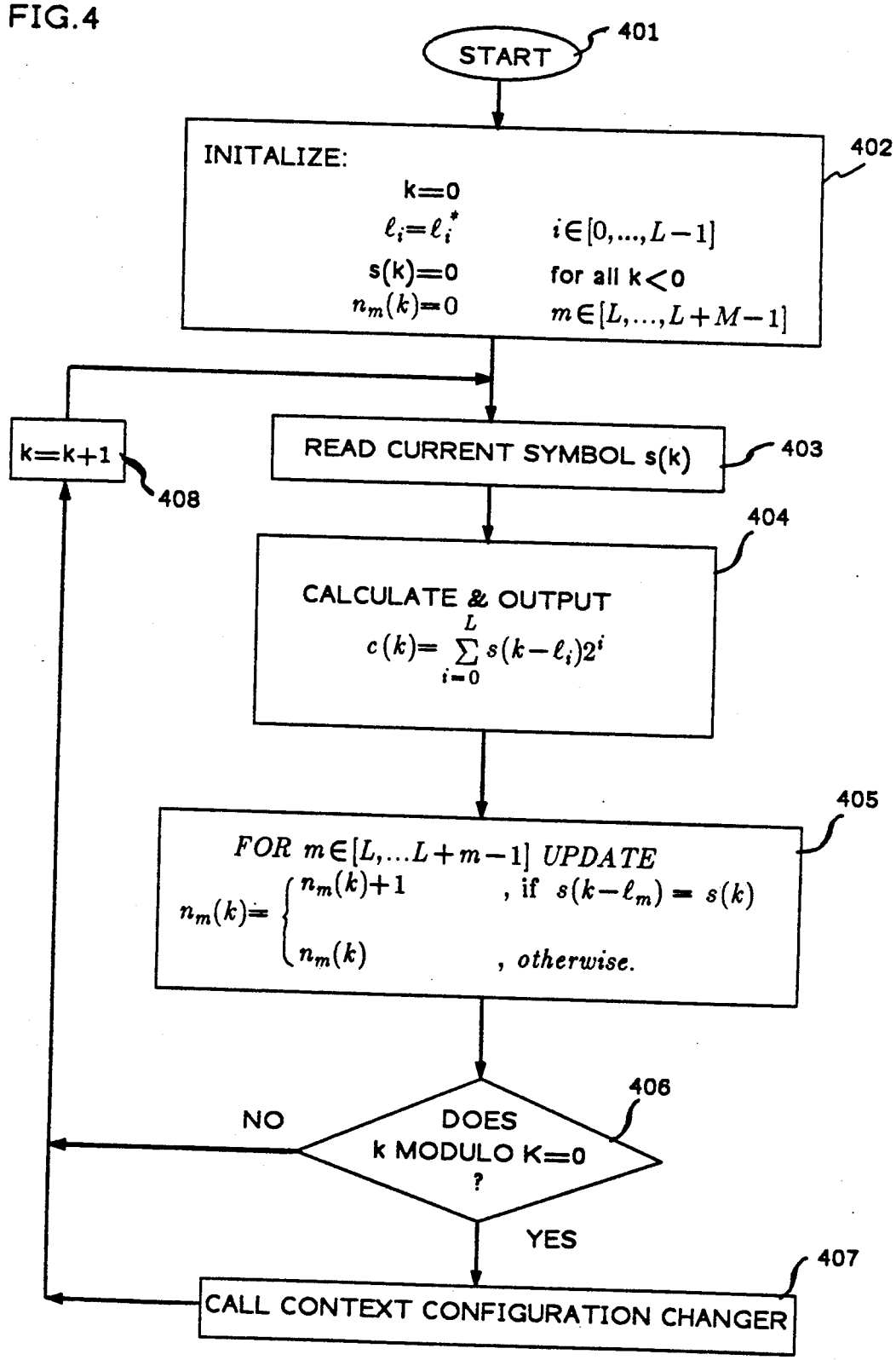
FIG. 4 depicts a flow chart illustrating the operation of elements of the adaptive context extractor employed in the encoder and decoder shown in FIG. 1.

The flow chart shown in FIG. 4 depicts the operation of elements of adaptive context extractor 105. Adaptive context extractor 105 provides a context $c(k)$, in accordance with an aspect of the invention, in such a way as to cause prediction to be more certain so that the probabilities being estimated by probability estimator 106 are closer either to zero (0) or one (1). Accordingly, operation of adaptive context extractor 105 is begun via start step 401. Thereafter, operational block 402 initializes $k=0$, $l_i=l_i^*$ for all $i\epsilon[0, \ldots, L+M-1]$ where "L" is the number of lag intervals in the fixed portion of the context configuration (in the above example $L=7$) and where "M" is the number of candidate lag intervals in a set from which a floating predictor will be selected (in the above example $M=10$). Operational block 402 also initializes $s(k)=0$ for all $k<0$ and $n_m(k)=0$ for all $m\epsilon[L, \ldots, L+M-1]$. The $n_m(k)$ are running counts to be explained below.

Operational block 403 causes the current symbol $s(k)$ to be read. Operational block 404 causes the context $c(k)$ to be calculated in accordance with $$c(k) = \sum_{i=0}^{L} s(k - l_i)2^i. \quad (1)$$

Context $c(k)$ is then supplied as an output to probability estimator 106 (FIG. 1). Operational block 405 causes the running counts $n_m(k)$ to be updated. It is to be noted that counts $n_m(k)$ provide an efficient and fast measure of predictive value. To this end, $n_m(k)$ are running counts of polarity coincidences, i.e., running counts of the number of times that $s(k)$ and $s(k-l_m)$ are the same. Thus, step 405 causes the updating of $n_m(k)$ for all $m\epsilon[L, \ldots, L+M-1]$ in accordance with $$n_m(k) = \begin{cases} n_m(k) + 1, & \text{if } s(k - l_m) = s(k) \\ n_m(k), & \text{otherwise.} \end{cases} \quad (2)$$

Conditional branch point 406 tests to determine if current time k is an allowed time for changing the context configuration. There is no need to allow possible changes in the context configuration at every time k and, consequently, processing overhead can be reduced by only periodically allowing context configuration changes. To this end step 406 tests to determine if $$k \text{ modulo } K=0, \quad (3)$$

where k is the symbol index and K is a predetermined parameter representative of the interval at which changes in the context configuration are to be allowed. If the test result in step 406 is NO, no change is to be made in the context configuration and operational block 407 increments the symbol index, namely, sets $k=k+1$. Thereafter, control is returned to step 403. If the test result in step 406 is YES, operational block 408 causes the context configuration changer to be called. Once the context configuration changer has run, operational block 407 increments the symbol index k and control is returned to step 403.

FIG. 5 is a flow chart of the context configuration changer used in the main adaptive context extractor of FIG. 4. Accordingly, the context configuration changer is entered via step 501. Thereafter, operational block 502 causes $l_{MAX}$ to be found in accordance with $$l_{MAX} = \max_{m\epsilon[L, \ldots, L + M - 1]} n_m(k) \quad (4)$$

and causes $i_{MAX}$ to be found which equals the smallest m in $[L, \ldots, L+M-1]$ such that $$n_m(k) = l_{MAX}, \quad (5)$$

Thus, $i_{MAX}$ is an index of the predictor for the current symbol offering the maximum correlation.

Operational block 503 causes $l_{MIN}$ to be found in accordance with $$l_{MIN} = \min_{m\epsilon[L, \ldots, L + M - 1]} n_m(k). \quad (6)$$

Conditional branch points 504 and 507 through 509 are employed to assure that the context configuration is not changed unless a significantly better prediction of the current symbol $s(k)$ will result. Accordingly, conditional branch point 504 tests to determine if $l_{MAX}$ is greater than a fraction of its maximum possible value K, namely, whether $$l_{MAX} > A \times K, \quad (7)$$

where A is a predetermined fraction. In one example, A is selected to be ⅝. If $l_{MAX}$ is not greater than a significant fraction of its maximum possible value K, none of the candidates for the at least one floating predictor in the context configuration are particularly good predictors and there is no need to change the context configuration. If the test result in step 504 is NO, the context configuration is not to be changed and operational block 505 sets the running counts to zero, namely, $$n_m(k)=0 \quad (8)$$

for all $m\epsilon[L, \ldots, L+m-1]$. Thereafter, control is returned to the main routine via step 506. If the test result in step 504 is YES, conditional branch point 507 tests to determine if $$l_{MAX}-l_{MIN} > B \times K, \quad (9)$$

where B is a predetermined fraction. In one example, B is selected to be ¼. When the condition of equation (9) is not satisfied all of the candidate lag intervals are approximately equally good predictors for the current symbol and, consequently, there is no need to change the context configuration. If the test result in step 507 is NO, the context configuration is not to be changed and steps 505 and 506 are iterated, as described above. If the test result in step 507 is YES, conditional branch point 508 tests to determine whether $$l_{MAX}-n_L(k) > K - l_{MAX}. \quad (10)$$

If the condition of equation (10) is not met, the improvement in prediction offered by changing the context configuration is not significant enough to warrant changing it. Thus, if the test result in step 508 is NO, the context configuration is not to be changed and steps 505 and 506 are iterated, as described above. If the test result in step 508 is YES, conditional branch point 509 tests to determine whether $$l_{MAX}-n_L(k) > K/C, \quad (11)$$

where C is a predetermined integer value. In one example, C is selected to be 64. If the condition of equation (11) is not met, the improvement in prediction offered by changing the context configuration is again not significant enough to warrant changing it. Thus, if the test result in step 509 is NO, the context configuration is not to be changed and steps 505 and 506 are iterated, as described above. If the test result in step 509 is YES, operational block 510 causes a change in the context configuration to occur by exchanging the more desirable lag interval with the lag interval currently in the floating predictor position. This is realized by setting $$l_{TEMP} = l_L$$

$$l_L = l_{iMAX}$$

$$l_{iMAX} = l_{TEMP}. \quad (12)$$

Thereafter, steps 505 and 506 are iterated, as described above and control is returned to the main routine. It is noted that an adjustment in the context configuration is enabled, i.e., allowed, only if the prescribed criteria of steps 504 and 507 through 509 are met.

The running counts $n_m(k)$ of polarity coincidences are measures of predictive value. Although this embodiment of the invention has been described assuming a bi-level signal, counting polarity coincidences would also provide a measure of predicitive value for multi-level signals.

Another possible measure of predictive value is correlation. A technique that could be advantageously used for obtaining correlations for multi-level and other signals is low-pass filtering. To this end, the products of the symbol value at a given time and the symbol value at some prior time are low-pass filtered to obtain the desired correlations. Such low-pass filtering techniques are known in the art.

Decoder 103 includes, in this example, line interface 108, entropy decoder unit 109, adaptive context extractor 110 and probability estimator 111. Line interface 108 performs the inverse function of line interface 107 and de-formats the incoming signal, in a known manner, to obtain the data stream a(i). Entropy decoder unit 109 performs the inverse function of entropy encoder unit 104. To this end, the received data stream a(i) and probability estimates $\vec{p}(k)$ from probability estimator 110 are supplied to entropy decoder unit 109 and used therein in known fashion to reconstruct the symbols s(k). Symbols s(k) are supplied to adaptive context extractor 110 which, in turn, provides context c(k) and supplies it to probability estimator 111. Again, such entropy decoder units are known in the art. See again the article entitled "Compression of Black-White Image with Arithmetic Coding" and U.S. Pat. No. 4,437,087, cited above, regarding binary applications and the article entitled "Arithmetic Coding For Data Compression", also cited above, for multilevel applications. Also see the article cited above regarding Huffman encoders/decoders entitled "Compression of Text and Binary Files Using Adaptive Huffman Coding Techniques". Adaptive context extractor 110 is identical to adaptive context extractor 105 in structure and operation and is not described again. Similarly, probability estimator 111 is identical to probability estimator 106 in structure and operation and is not described again.

We claim:

1. An encoder for encoding a supplied signal having a plurality of symbol values including,
   means for extracting a context dependent on a configuration of prior symbols of said supplied signal,
   probability estimator means being responsive to said supplied signal and said context for generating probability estimates of said supplied signal,
   entropy encoder means being responsive to said supplied signal and said probability estimates for generating an encoded version of said supplied signal,
   said means for extracting a context being
   characterized by
   said prior symbols being at prescribed lag intervals relative to a current symbol being encoded, and
   means responsive to said supplied signal for adaptively adjusting said configuration.

2. An encoder as defined in claim 1 wherein said means for adaptively adjusting includes means for enabling adjustment of said configuration only at times when prescribed criteria based on correlation between signal values at said lag intervals are met.

3. An encoder as defined in claim 1 further including means for interfacing said entropy encoder to a transmission media.

4. An encoder as defined in claim 1 wherein said configuration includes a predetermined portion comprised of at least one of said lag intervals and an adjustable portion comprised of at least one floating lag interval in response to said supplied signal.

5. An encoder as defined in claim 1 wherein said means for adaptively adjusting includes means for selecting said at least one floating lag interval from a predetermined set of candidate lag intervals.

6. An encoder as defined in claim 5 wherein said means for selecting includes means for obtaining a measure of predictive value of each prior symbol at said lag intervals in said predetermined set of candidate lag intervals and means for selecting from said set of candidate lag intervals at least one of said lag intervals referencing a symbol having the greatest predictive value to be included as said floating predictor lag interval in said configuration.

7. An encoder as defined in claim 6 wherein said means for obtaining a measure of predictive value includes means for obtaining a measure of correlation at each of said candidate lag intervals and wherein said means for selecting includes means for determining which at least one of said lag intervals in said set is to be included in said configuration based on said correlations.

8. An encoder as defined in claim 7 wherein said means for determining identifies an at least one lag interval of said set of candidate lag intervals having the maximum correlation and further including means for incorporating said identified at least one lag interval into said configuration.

9. An encoder as defined in claim 6 wherein said means for obtaining a measure of predictive value includes means for counting polarity coincidences between said current symbol and symbols at said candidate lag intervals and wherein said means for selecting is responsive to counts of said polarity coincidences to select as said at least on lag interval to be included in said configuration at least one of said candidate lag intervals having the maximum count of said polarity coincidences.

10. A decoder for reconstructing an original signal having a plurality of symbol values from a compressed data signal including,
   means for extracting a context dependent on a configuration of prior symbols of a reconstructed signal,
   probability estimator means being responsive to said reconstructed signal and said context for generating probability estimates of said reconstructed signal,
   entropy decoder means being responsive to said compressed data signal and said probability estimates for generating a reconstructed version of the original signal,
   said means for extracting a context being,
   characterized by
   said prior symbols being at prescribed lag intervals relative to a current symbol being decoded, and
   means responsive to said reconstructed signal for adaptively adjusting said configuration.

11. A decoder as defined in claim 10 wherein said means for adaptively adjusting includes means for enabling adjustment of said configuration only at time when prescribed criteria based on correlation between signal values at said lag intervals are met.

12. A decoder as defined in claim 10 further including means for interfacing said entropy decoder means to a transmission media.

13. A decoder as defined in claim 1 wherein said configuration includes a predetermined portion comprised of at least one of said lag intervals and an adjustable portion comprised of at least one floating lag interval determined in response to said supplied signal.

14. A decoder as defined in claim 13 wherein said means for adaptively adjusting includes means for selecting said at least one floating lag interval from a predetermined set of candidate lag intervals.

15. A decoder as defined in claim 14 wherein said means for selecting includes means for obtaining a measure of predictive value of each prior symbol at said lag intervals in said predetermined set of cadidate lag intervals and means for selecting from said set of candidate lag intervals at least one of said lag intervals referencing a symbol having the greatest predictive value to be included as said floating predictor lag interval in said configuration.

16. A decoder as defined in claim 15 wherein said means for obtaining a measure of predictive value obtains a measure of correlation at each of said candidate lag intervals and wherein said means for selecting includes means for determining which at least one of said lag intervals in said set is to be included in said configuration based on said correlations.

17. A decoder as defined in claim 16 wherein said means for determining identifies an at least one lag interval of said set of candidate lag intervals having the maximum correlation and further including means for incorporating said identified at least one lag interval into said configuration.

18. A decoder as defined in claim 15 wherein said means for obtaining a measure of predictive value includes means for counting polarity coincidences between said current symbol and symbols at said candidate lag intervals and wherein said means for selecting is responsive to counts of said polarity coincidences to select as said at least one lag interval to be included in said configuration at least one of said candidate lag intervals having the maximum count.

19. A method of encoding a supplied signal having a plurality of symbol values including the steps of,
   extracting a context from said supplied signal dependent on a configuration of prior symbols of said supplied signal,
   generating probability estimates of said supplied signal in response to said supplied signal and said context,
   entropy encoding said supplied signal in response to said supplied signal and said probability estimates to generate an encoded version of said supplied signal,
   said step of extracting a context being,
   characterized by
   said prior symbols being at prescribed lag intervals relative to said current symbol being encoded, and
   adaptively adjusting said configuration in response to said supplied signal.

20. A method of decoding a compressed data signal representative of an encoded version of an original supplied signal to obtain a reconstructed signal having a plurality of symbol values including the steps of,
   extracting a context from a reconstructed signal dependent on a configuration of prior symbols of said reconstructed signal,
   generating probability estimates of said reconstructed signal in response to said reconstructed signal and said context,
   entropy decoding said compressed data signal in response to said compressed data signal and said probability estimates to generate said reconstructed signal version of the original signal,
   said step of extracting a context being,
   characterized by
   said prior symbols being at prescribed lag intervals relative to said current symbol being decoded, and
   adaptively adjusting said configuration in response to said supplied signal.

* * * * *

UNITED STATES PATENT AND TRADEMARK OFFICE
CERTIFICATE OF CORRECTION

PATENT NO. : 5,023,611

DATED : June 11, 1991

INVENTOR(S) : Christodoulos Chamzas and Donald L. Duttweiler

It is certified that error appears in the above-identified patent and that said Letters Patent is hereby corrected as shown below:

, Column 7, Line 55
U.S. Patent No. "4,437,087" should read --4,633,490--.

Signed and Sealed this

Sixteenth Day of February, 1993

Attest:

STEPHEN G. KUNIN

Attesting Officer

Acting Commissioner of Patents and Trademarks